United States Patent
Hong et al.

(10) Patent No.: US 10,800,319 B2
(45) Date of Patent: Oct. 13, 2020

(54) ELECTROSTATIC CAPACITY SWITCHING UNIT

(71) Applicant: LS AUTOMOTIVE CORP, Ansan-si, Gyeonggi-do (KR)

(72) Inventors: Soon Min Hong, Bucheon-si (KR); Min Seok Kwon, Bucheon-si (KR); Bong Gi Song, Hwaseong-si (KR); Sung Hwan Shin, Seoul (KR)

(73) Assignee: LS AUTOMOTIVE TECHNOLOGIES CO., LTD., Anyang-si, Gyeonggi-do (KR)

( * ) Notice: Subject to any disclaimer, the term of this patent is extended or adjusted under 35 U.S.C. 154(b) by 0 days.

(21) Appl. No.: 15/600,103

(22) Filed: May 19, 2017

(65) Prior Publication Data

US 2018/0032200 A1 Feb. 1, 2018

(30) Foreign Application Priority Data

Jul. 29, 2016 (KR) .................. 10-2016-0097422

(51) Int. Cl.
*B60K 37/06* (2006.01)
*B60Q 1/14* (2006.01)
*H03K 17/96* (2006.01)

(52) U.S. Cl.
CPC ............ *B60Q 1/1484* (2013.01); *B60K 37/06* (2013.01); *H03K 17/962* (2013.01);
(Continued)

(58) Field of Classification Search
CPC .. G06F 3/0416; B60Q 1/1484; H03K 17/962; H03K 2017/9602; H03K 2217/960775; B60K 37/06; B60K 2370/1468
See application file for complete search history.

(56) References Cited

U.S. PATENT DOCUMENTS

2013/0314109 A1 11/2013 Kremin et al.
2015/0103047 A1* 4/2015 Hanauer ............... G06F 3/0416
345/174
(Continued)

FOREIGN PATENT DOCUMENTS

JP 2009-181232 A 8/2009
JP 2015-31552 A 2/2015
JP 2018-502464 A 1/2018

OTHER PUBLICATIONS

Soon Min Hong et al., "Study of Waterproof Method for Capacitive Sensor Application", KSAE 2016 Annual Spring Conference, May 19, 2016.

*Primary Examiner* — Jeff Piziali
(74) *Attorney, Agent, or Firm* — Rabin & Berdo, P.C.

(57) ABSTRACT

The present invention provides a capacitive switch device comprising: a touch sensing unit (100) including a sensing electrode (110) and a transmission electrode (120), which are disposed on a substrate (2); and a touch control module (200) disposed on a substrate (2), and configured to confirm a manipulator's contact manipulation state based on a sensing signal from the touch sensing unit (100) and output a touch output signal, wherein the transmission electrode (120) outputs a transmission signal in response to a transmission control signal from the touch control module (200), and the sensing electrode (110) detects a signal in response to a sensing control signal from the touch control module (200) for application to the touch control module (200), and wherein the touch control module (200) activates the sensing electrode (110) and the transmission electrode (120) according to a preset mode, and a method for controlling the same.

10 Claims, 7 Drawing Sheets

(52) U.S. Cl.
CPC ........... *B60K 2370/1468* (2019.05); *H03K 2017/9602* (2013.01); *H03K 2217/960775* (2013.01)

(56) References Cited

U.S. PATENT DOCUMENTS

| | | | |
|---|---|---|---|
| 2015/0177298 A1* | 6/2015 | Sugiura | G06F 3/044 324/658 |
| 2015/0193043 A1* | 7/2015 | Yang | G06F 3/044 345/174 |
| 2015/0220185 A1* | 8/2015 | Kim | G06F 3/044 345/174 |
| 2015/0293625 A1* | 10/2015 | Narayanasamy | H03K 17/962 345/174 |
| 2015/0355708 A1* | 12/2015 | Lee | G06F 3/041 345/173 |
| 2015/0355771 A1* | 12/2015 | Watazu | G06F 3/0414 345/174 |
| 2016/0041639 A1* | 2/2016 | Kaltner | G06F 3/044 345/173 |
| 2016/0041654 A1* | 2/2016 | Bulea | G06F 3/044 345/174 |
| 2016/0048243 A1* | 2/2016 | Bulea | G06F 3/044 345/174 |
| 2016/0077636 A1* | 3/2016 | Jordan | G06F 3/044 345/174 |
| 2016/0077638 A1* | 3/2016 | Bulea | G06F 3/044 345/174 |
| 2016/0091999 A1* | 3/2016 | Dattalo | H03K 17/9622 345/174 |
| 2016/0117014 A1* | 4/2016 | Davison | H03K 17/962 345/174 |
| 2016/0357299 A1* | 12/2016 | Liu | G06F 3/044 |
| 2017/0139540 A1 | 5/2017 | Davison et al. | |

\* cited by examiner

ELECTROSTATIC CAPACITY SWITCHING UNIT

CROSS-REFERENCE TO RELATED APPLICATIONS

This application claims the benefit of Korean Patent Application No. 10-2016-0097422, filed on Jul. 29, 2016 in the Korean Intellectual Property Office, which is incorporated herein by reference in its entirety.

STATEMENT REGARDING PRIOR DISCLOSURES BY THE INVENTOR OR A JOINT INVENTOR

Applicant hereby states under 37 CFR 1.77(b)(6) that Soon Min HONG, Min Seok KWON, Bong Gi SONG and Sung Hwan SHIN, *Study of Waterproof Method for Capacitive Sensor Application*, KSAE 2016 Annual Spring Conference, May 19, 2016, are designated as a grace period inventor disclosure. The disclosure: (1) was made one year or less before the effective filing date of the claimed invention; (2) names the inventor or a joint inventor as an author; and (3) does not name additional persons as authors on a printed publication.

BACKGROUND OF THE INVENTION

1. Field of the Invention

The present invention relates to a capacitive switch device, and more particularly, to a capacitive switch device having a simplified configuration, which enables both a smoother operation and a compact arrangement structure in order to more precisely detect the contact with the human body.

2. Description of Related Art

A vehicle such as a car requires its functions as a variety of kinds of convenient means capable of providing a more stable and comfortable traveling state for a user in addition to its function as a means for movement. Thus, the vehicle is equipped with various convenient facilities, a variety of kinds of switches for operating and controlling them, and devices for displaying them.

Various switches are concentratedly disposed at the vehicle's steering wheel to improve a driver's convenience. According to circumstances, the complicated physical arrangement of the switches may permit the driver to cause an erroneous operation or fix his or her eyes to the steering wheel, thus leading to an increase in the risk of occurrence of safety accidents For the purpose of smoother manipulation and operation of the switches, the coverage of a capacitive touch sensing type capacitive switch as a substitute for a conventional mechanical switch having poor durability is being extended. A capacitive touch sensing method can be typically divided into a self-capacitance type and a mutual-capacitance type. A capacitance value obtained at a sensor electrode varies and a reference value (i.e., baseline) moving along with the variation in the obtained capacitance value is set. When a difference between the capacitance value obtained at the sensor electrode and the reference value (i.e., baseline) exceeds a specific threshold value, it is determined that the human body is touched. In this case, the conventional baseline does not reflect the value obtained at the sensor electrode. When the difference between the value obtained at the sensor electrode and the reference value is less than the specific threshold value, the baseline reflects the value obtained at the sensor electrode. At this moment, the sensor determines that the human body is separated from the sensor.

However, the conventional mechanical switch causes an erroneous operation and a reduction in life cycle due to abrasion of consumable components such as a mechanism and a spring according to the repetitive use thereof, brings about an increase in the kind and the number of the components, and consumes a lot of man hour. In addition, in the case where a conventional capacitive sensor is used as a single button, a single method based on self-capacitance or mutual-capacitance is employed. In either case, the conventional mechanical switch involves a problem in that the capacitive sensor is susceptible to the influence of the ambient environment such as temperature and moisture/magnetic field. In other words, when the ambient environment such as water, magnetic fields, and electric fields is greatly changed abruptly, an existing touch algorithm determines that the human body is touched, and there is also a problem in that the touch algorithm maintains a state in which the human body has been touched until the abruptly changed environment returns to its original state.

SUMMARY OF THE INVENTION

Accordingly, the present invention has been made to solve the above-mentioned problems occurring in the prior art, and it is an object of the present invention to provide a capacitive switch device which enables combined-capacitance measurement, and a reference value reflects a capacitance value obtained at a sensor electrode to reflect a signal attenuation state in which a human body touch occurs so that more precise touch detection can be achieved, and a control method thereof.

To achieve the above object, in one aspect, the present invention provides a capacitive switch device comprising: a touch sensing unit 100 including a sensing electrode 110 and a transmission electrode 120, which are disposed on a substrate 2; and a touch control module 200 disposed on a substrate 2, and configured to confirm a manipulator's contact manipulation state based on a sensing signal from the touch sensing unit 100 and output a touch output signal, wherein the transmission electrode 120 outputs a transmission signal in response to a transmission control signal from the touch control module 200, and the sensing electrode 110 detects a signal in response to a sensing control signal from the touch control module 200 for application to the touch control module 200, and wherein the touch control module 200 activates the sensing electrode 110 and the transmission electrode 120 according to a preset mode.

In the capacitive switch device, the sensing electrode 110 and the transmission electrode 120 may be respectively disposed on both surfaces of the substrate 2.

In the capacitive switch device, the sensing electrode 110 and the transmission electrode 120 may be disposed on the same surface of the substrate 2.

In the capacitive switch device, the transmission electrode 120 may be disposed at the outer periphery of the sensing electrode 110.

In the capacitive switch device, the touch control module 200 may include: a touch sensor control unit 21 configured to apply the transmission control signal to the transmission electrode 120 and the sensing control signal to the sensing electrode 110, and control the activation of the transmission electrode 120 and the sensing electrode 110; a signal processing unit 23 configured to process a signal detected by the sensing electrode 110; and a signal output unit 25 configured to output the signal processed by the signal processing unit 23 to the outside.

In the capacitive switch device, the touch sensor control unit 21 may execute a self-capacitance measurement mode of activating the sensing electrode 110 and deactivating the transmission electrode 120.

In the capacitive switch device, the touch sensor control unit 21 may execute a mutual-capacitance measurement mode of deactivating the sensing electrode 110 and activating the transmission electrode 120.

In the capacitive switch device, the touch sensor control unit 21 may execute a combined-capacitance measurement mode of activating the sensing electrode 110 and the transmission electrode 120.

In another aspect, the present invention provides a method for controlling a capacitive switch device, the method comprising: a provision step of providing the capacitive switch device which comprises: a touch sensing unit 100 including a sensing electrode 110 and a transmission electrode 120, which are disposed on a substrate 2; and a touch control module 200 disposed on a substrate 2, and configured to confirm a manipulator's contact manipulation state based on a sensing signal from the touch sensing unit 100 and output a touch output signal, wherein the transmission electrode 120 outputs a transmission signal in response to a transmission control signal from the touch control module 200, and the sensing electrode 110 detects a signal in response to a sensing control signal from the touch control module 200 for application to the touch control module 200, and wherein the touch control module 200 activates the sensing electrode 110 and the transmission electrode 120 according to a preset mode; a detection step S10 of allowing the touch sensing unit 100 to detect whether or not there is the manipulator's manipulation in response to a control signal from the touch control module 200; a signal pattern analysis step S20 of analyzing and confirming a sensing signal detected in the detection step S10 and determining whether or not there is the manipulator's contact and touch operation; a reference value update step S30 of updating a reference value of the touch sensing unit 100 using a sensing signal calculated in the signal pattern analysis step S20; and an output mode execution step S40 of executing an output mode of determining whether or not to output an output signal based on a result of the determination performed in the signal pattern analysis step S20.

In the capacitive switch device control method, the touch control module 200 may include: a touch sensor control unit 21 configured to apply the transmission control signal to the transmission electrode 120 and the sensing control signal to the sensing electrode 110, and control the activation of the transmission electrode 120 and the sensing electrode 110; a signal processing unit 23 configured to process a signal detected by the sensing electrode 110; and a signal output unit 25 configured to output the signal processed by the signal processing unit 23 to the outside. The detection step S20 may include one or more of a step S11 of detecting a self-capacitance measurement mode of activating the sensing electrode 110 and deactivating the transmission electrode 120, a step S13 of detecting a mutual-capacitance measurement mode of deactivating the sensing electrode 110 and activating the transmission electrode 120, and a step S15 of detecting a combined-capacitance measurement mode of activating the sensing electrode 110 and the transmission electrode 120, the self-capacitance measurement mode, the mutual-capacitance measurement mode, and the combined-capacitance measurement mode being executed by the touch sensor control unit 21.

In the capacitive switch device control method, the signal pattern analysis step S20 may include: a human body touch confirmation step (S20a, S21, and S211) of determining and confirming whether or not the manipulator's body is touched with the touch sensing unit 200; a touch manipulation confirmation step (S23, S231, S233, S235, S237, and S239) of determines whether or not the human body touch state is sustained based on a result of the determination of whether there is a human body touch in the human body touch confirmation step (S21 and S211) to confirm the manipulator's touch manipulation intention; and an idle state control confirmation step (S25 and S251) of controlling an idle state of the touch sensing unit 100 based on a result of the confirmation of the manipulator's touch manipulation intention in the touch manipulation confirmation step.

In the capacitive switch device control method, the touch control module 200 may further include a storage unit configured to store preset data including an initial value, and the human body touch confirmation step (S20a, S21, and S211) comprises: a delta capacitance confirmation step S20a of confirming whether or not the touch sensing unit 100 is in an idle state (IDLE=ON), and allowing the sensing electrode of the touch sensing unit 100 to confirm a delta capacitance value as a difference between an actual capacitance value and a reference value from the sensing signal; a human body touch determination step S21 of comparing the delta capacitance value with a preset attenuation amount included in the preset data stored in the storage unit 30 to determine whether or not there is a human body touch in the idle state of the touch sensing unit 100; and a human body touch on-setting step S211 of, if the delta capacitance value is a negative number that is smaller than the preset attenuation amount in the human body touch determination step S21, determining a human body touch (HT) state in which the manipulator's body is touched with the touch sensing unit 100 to be ON.

In the capacitive switch device control method, the touch manipulation confirmation step (S23, S231, S233, S235, S237, and S239) may include: a human body touch (HT) state determination step S23 of determining whether or not the human body touch state confirmed in the human body touch confirmation step (S20a, S21, and S211) is an ON state; a human body touch maintenance determination step S231 of, if it is determined in the human body touch confirmation step (S20a, S21, and S211) that the human body touch state is an ON state, determining whether or not a sensing signal indicating a touch state of the touch sensing unit 100 is sustained; a touch maintenance counter incrementation step S233 of, if it is determined in the human body touch maintenance determination step S231 that the touch state is maintained, incrementing a touch maintenance counter using a counter 27 of the touch control module 200; a maintenance reference time lapse determination step S235 of comparing a touch maintenance time with a maintenance reference time (ts) included in the preset data after the touch maintenance counter incrementation step S233 and determining whether or not a touch maintenance state is maintained for a predetermined time period; and a touch state confirmation step S237, if it is determined in the maintenance reference time lapse determination step S235 that the touch maintenance time exceeds the maintenance reference time (ts), switching the touch detection state of the touch sensing unit 100 to ON, and setting the idle state of the touch sensing unit 100 to ON.

In the capacitive switch device control method, the reference value update step S30 may include calculating and updating the reference value using a previous delta capacitance calculated from an initial set value or a previous sensing signal, and a current delta capacitance calculated from a current sensing signal in the signal pattern analysis step.

In the capacitive switch device control method, the output mode execution step (S40 and S50) may include: a touch detection state determination step S40 of determining whether or not the touch detection state is an ON state; and an output control step S50 of, if it is determined in the touch detection state determination step S40 that the touch detection state is the ON state, switching the touch detection state to an OFF state and controlling an output control signal to be outputted to the outside through the signal output unit.

In the capacitive switch device control method, the output control step S50 may include: a signal output step S511 of, if it is determined in the touch detection state determination step S40 that the touch detection state is the ON state, switching the touch detection state to the OFF state and controlling the output control signal for application to the signal output unit to switch an output signal to the ON state to be outputted to the outside; an output switching standby step S513 of waiting for a preset time included in the preset data; and an output signal off-setting step S515 of, if there is a wait for more than the preset time in the output switching standby step S513, switching the state of the output signal to OFF to interrupt the output of the signal to the outside from the signal output unit.

The capacitive switch device according to the embodiments of the present invention as constructed above have the following advantageous effects.

A self-capacitance and a mutual-capacitance are simultaneously or selectively measured in a time division manner with respect to a single button using two electrodes. In addition, when the self-capacitance is measured, a transmission sensor (i.e., TX sensor) is activated to extract a combined signal obtained by fusing the mutual-capacitance and the self-capacitance, and analyze a waveform change pattern of the signal obtained through the extraction to determine whether or not the human body is touched, thereby avoiding an erroneous operation due to an external environmental impact.

In addition, the inventive capacitive switch device allows a capacitance value obtained at a sensor electrode to be set to be continuously reflected by a reference value (i.e., baseline) at a constant cycle, and recognizes and processes a constant pattern appearing consistently until the human body is contacted with and separated from the sensor, thereby minimizing the external environmental impact.

Further, the inventive capacitive switch device includes a basic configuration made up of a PCB, a plastic product casing, and a filler filled therein so that the number of components and thus a man-hour for assembly can be reduced relatively compared to a complicated mechanical switch made up of a spring, a latch, a lever, a casing and the like.

The sensor is designed to be disposed on the PCB at the inside of the plastic casing so that the inventive capacitive switch device can be used semi-permanently due to less consumption and abrasion of components despite the long-term use thereof, thus leading to a relative improvement in durability compared to the mechanical switch.

BRIEF DESCRIPTION OF THE DRAWINGS

The above and other objects, features and advantages of the present invention will be apparent from the following detailed description of the preferred embodiments of the invention in conjunction with the accompanying drawings, in which.

EXPLANATION OF SYMBOLS

Figure 1:
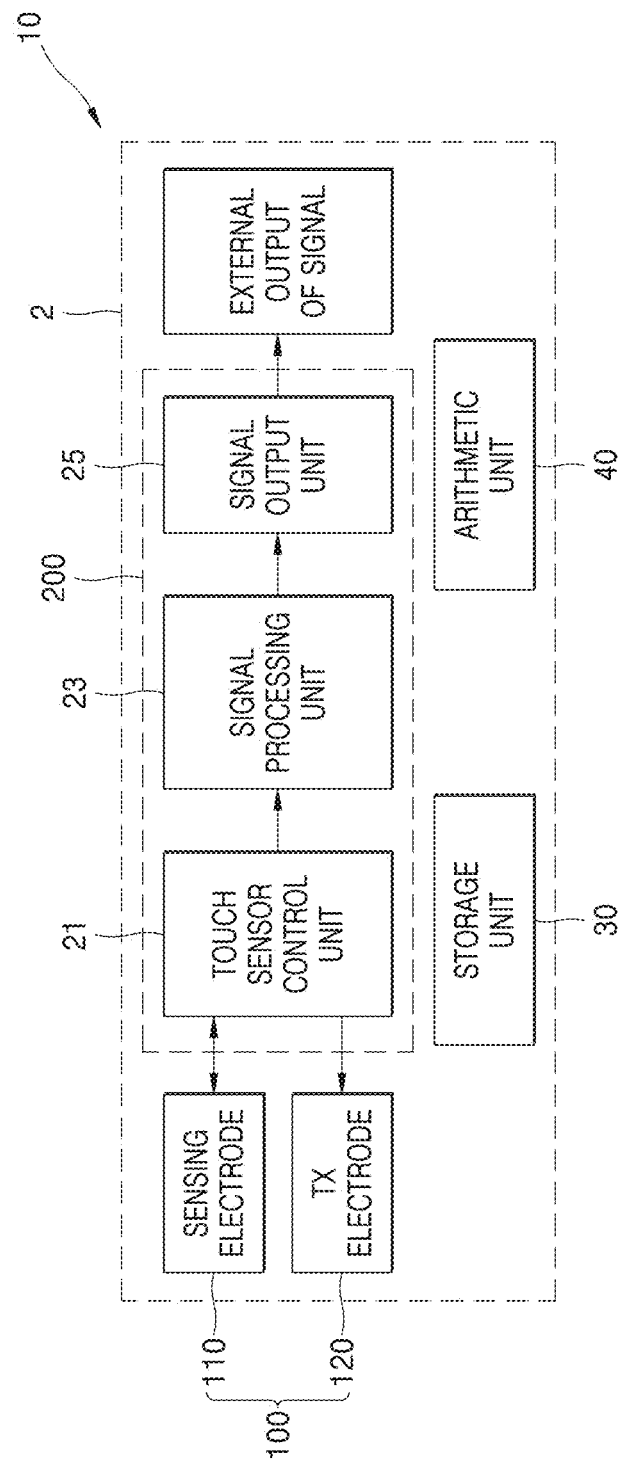
FIG. 1 is a schematic block diagram showing a capacitive switch device according to an embodiment of the present invention.
Figure 2:
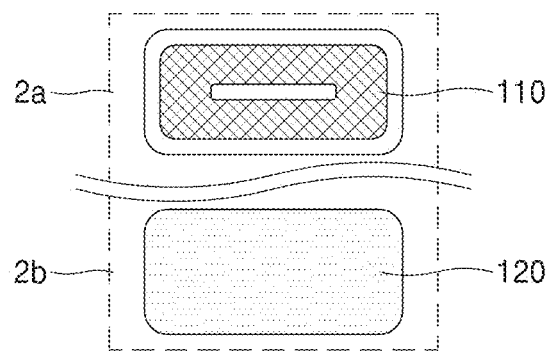
FIGS. 2 and 3 are schematic views showing a configuration and a modification example of a touch sensing unit of a capacitive switch device according to an embodiment of the present invention.
Figure 3:
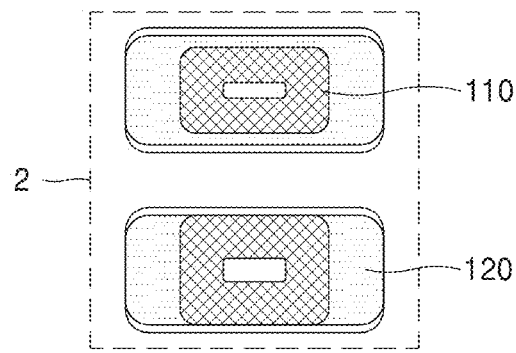

10: capacitive switch device
100: touch sensing unit
200: touch control module

DESCRIPTION OF THE PREFERRED EMBODIMENTS

Hereinafter, the configuration and operation of a capacitive switch device of the present invention will be described in detail with reference to the accompanying drawings.

A capacitive switch device according to an embodiment of the present invention includes a touch sensing unit 100 and a touch control module 200. Other constituent elements are at least partially disposed within a housing (not shown), and a substrate 2 is disposed within the housing. Electrical elements are disposed on the substrate 2. The substrate 2 may be modified in various manners depending on design specifications, such as being formed as a printed circuit board, a flexible substrate, or an insert injection-molded substrate. In this embodiment, a description of the detailed configuration of a separate housing, a substrate and the like will be omitted and a description will be made centering on an essential configuration.

The touch sensing unit 100 includes a sensing electrode 110 and a transmission electrode 120, which are disposed on the substrate 2. The sensing electrode 110 and the transmission electrode 120 disposed on the substrate are formed as predetermined conductive electrodes. The sensing electrode 110 is used to detect and measure a self-capacitance and a mutual-capacitance. The transmission electrode (i.e., TX electrode) 120 disposed on the substrate 2 is used to measure a mutual-capacitance. In other words, the transmission electrode 120 implements a predetermined transmission operation in response to a sensing control signal from a touch sensor control unit 21 of the touch control module 200 which will be described later. The transmission electrode 120 forms an electric field at the sensing electrode 110 in response to the sensing control signal, and provides a sensing signal indicating that a user's contact with the switch device is sensed through an electrode capacitance change caused by proximity and contact of the user.

The sensing electrode 110 and the transmission electrode 120 of the touch sensing unit 100 may take a structure in which the sensing electrode 110 and the transmission electrode 120 are respectively disposed on both surfaces of the substrate 2.

In other words, as shown in the drawings, the touch sensing unit 100 may take a structure in which the sensing electrode 110 and the transmission electrode 120 are separately formed on both surfaces 2a and 2b of the substrate 2, respectively. By virtue of this structure, a compact configuration may be enabled in which the formation region of the touch sensing unit on the substrate is restricted.

In addition, the touch sensing unit 100 may take a structure in which the sensing electrode 110 and the transmission electrode 120 are formed on one surface, i.e., the same surface of the substrate 2. Also, as shown in the drawings, the touch sensing unit 100 may take a structure in which the sensing electrode 110 and the transmission electrode 120 are disposed on the same surface of the substrate as well as on the same layer thereof. In other words, the touch sensing unit 100 may take a structure in which the sensing electrode 110 is disposed at a central portion of the substrate 2 and the transmission electrode 120 is disposed at a peripheral portion of the substrate 2 in such a manner as to surround the outer periphery of the sensing electrode 110 to increase a touch sensing sensitivity.

The touch control module 200 is disposed on a substrate 2, and serves to confirm a manipulator's contact manipulation state based on a sensing signal from the touch sensing unit 100 and output a touch output signal. In other words, the transmission electrode 120 outputs a transmission signal in response to a transmission control signal from the touch control module 200, the sensing electrode 110 detects a signal in response to a sensing control signal from the touch control module 200 for application to the touch control module 200, and the touch control module 200 activates the sensing electrode 110 and the transmission electrode 120 according to a preset mode.

More specifically, the touch control module 200 includes a touch sensor control unit 21, a signal processing unit 23, and a signal output unit 25.

The touch sensor control unit 21 applies the transmission control signal to the transmission electrode 120 and applies the sensing control signal to the sensing electrode 110. In addition, the touch sensor control unit controls the activation of the transmission electrode 120 and the sensing electrode 110. The activation control of the touch sensor control unit 21 can establish the sole activation of the sensing electrode 110, the sole activation of the transmission electrode 120, and the activation of the sensing electrode 110 and the transmission electrode 120.

Figure 4:
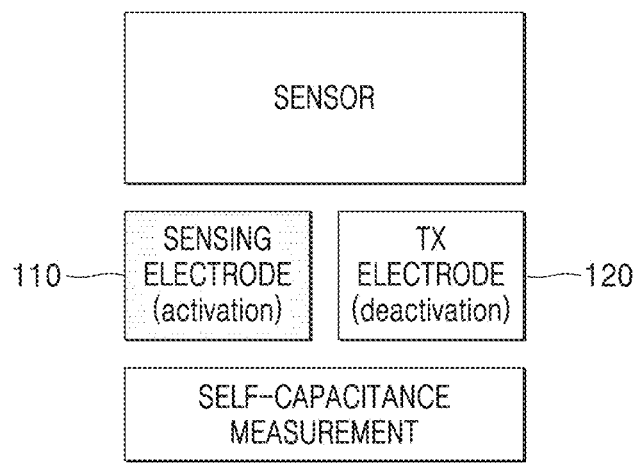
FIGS. 4 to 6 are configuration views showing an activation or deactivation state of a touch sensing unit of a capacitive switch device according to an embodiment of the present invention.

In other words, the touch sensor control unit 21 can execute a self-capacitance measurement mode of activating the sensing electrode 110 and deactivating the transmission electrode 120 so that a capacitance, i.e., a touch detection can be established in a self-capacitance manner (see FIG. 4).

Figure 5:
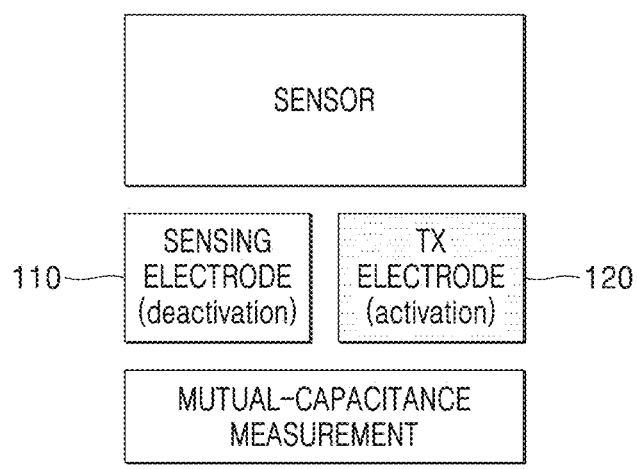
Figure 6:
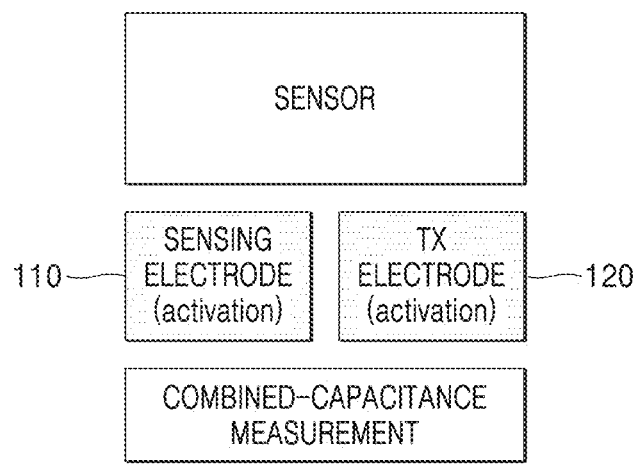

In addition, the touch sensor control unit 21 can execute a mutual-capacitance measurement mode of deactivating the sensing electrode 110 and activating the transmission electrode 120 so that a capacitance, i.e., a touch detection can be established in a mutual-capacitance manner (see FIG. 5). The touch sensor control unit 21 can execute a combined-capacitance measurement mode of activating the sensing electrode 110 and the transmission electrode 120 so that a capacitance, i.e., a touch detection can be established in a combined-capacitance manner in which the self-capacitance and the mutual-capacitance are combined (see FIG. 6).

The signal processing unit 23 serves to process a signal detected by the sensing electrode 110. The signal processing unit 23 receives the signal detected by the sensing electrode 110 and converts the received signal into a predetermined capacitance value. At this time, the calculated capacitance value can be stored in a storage unit 30 or a predetermined delta capacitance value can be calculated through an arithmetic unit 40 on the basis of preset data stored in the storage unit 30. In addition, the signal processing unit 23 analyzes a signal pattern using data calculated from the detected signal and performs an operation of determining a user's direct contact or operation intention or the like.

The signal output unit 25 serves to output the signal processed by the signal processing unit 23 to the outside. The processed signal to be outputted from the signal output unit 25 to the outside can be transferred to an external control unit or an external storage unit. In other words, the signal output unit 25 receives the processed signal and an output control signal from the signal processing unit 23. When a normal touch operation of the user is performed, the signal output unit 25 can output a predetermined output signal to the external control unit.

As described above, the touch control module 200 may further include a storage unit 30. According to circumstances, the touch control module 200 may further include a separate arithmetic unit 40 in addition to the signal processing unit. The storage unit 30 can store preset data that includes an initial value for a reference value, a preset attenuation amount, and a maintenance reference time (ts), and can be electrically connected with the signal processing unit 23 to perform a predetermined storage operation or a function of withdrawing the data stored therein. The arithmetic unit 40 may be additionally disposed if the signal processing unit needs to be complemented or an arithmetic logic operation is further needed in a determination process of a predetermined touch operation in addition to a signal processing operation.

Hereinafter, a method for controlling the capacitive switch device 10 will be described with reference to the accompanying drawings.

The method for controlling the capacitive switch device 10 according to an embodiment of the present invention includes a provision step S1, a detection step S10, a reference value update step S30, and an output mode execution step S40.

In the provision step S1, the capacitive switch device 10 is provided. As described above, the capacitive switch device 10 includes: a touch sensing unit 100 including a sensing electrode 110 and a transmission electrode 120, which are disposed on a substrate 2; and a touch control module 200 disposed on a substrate 2, and configured to confirm a manipulator's contact manipulation state based on a sensing signal from the touch sensing unit 100 and output a touch output signal. The transmission electrode 120 outputs a transmission signal in response to a transmission control signal from the touch control module 200, the sensing electrode 110 detects a signal in response to a sensing control signal from the touch control module 200 for application to the touch control module 200, and the touch control module 200 activates the sensing electrode 110 and the transmission electrode 120 according to a preset mode.

In the detection step S10, the touch sensing unit 100 detects whether or not there is the manipulator's manipulation in response to a control signal from the touch control module 200. As described above, the touch control module 200 comprises: a touch sensor control unit 21 configured to apply the transmission control signal to the transmission electrode 120 and the sensing control signal to the sensing electrode 110, and control the activation of the transmission electrode 120 and the sensing electrode 110; a signal processing unit 23 configured to process a signal detected by the sensing electrode 110; and a signal output unit 25 configured to output the signal processed by the signal processing unit 23 to the outside. The detection step S10 includes one or more of a self-capacitance measurement mode detection step S11, a mutual-capacitance measurement mode detection step S13, and a combined-capacitance measurement mode detection step S15.

In the self-capacitance measurement mode detection step S11, the sensing electrode 110 is activated and the transmission electrode 120 is deactivated to measure a self-capacitance value through the touch sensing unit 100. In the mutual-capacitance measurement mode detection step S13, the sensing electrode 110 is deactivated and the transmission electrode 120 is activated to measure a mutual-capacitance value through the touch sensing unit 100. In the combined-capacitance measurement mode detection step S15, the sensing electrode 110 and the transmission electrode 120 are activated to measure a combined-capacitance value.

According to circumstances, the detection step can be configured in various manners depending design specifications, such as being performed selectively or alternatively by a user's predetermined input or selection, but may take a configuration of simultaneously or sequentially selecting separate measurement modes through a single touch sensing unit 100 in this embodiment.

Thereafter, the signal processing unit 23 of the touch control module 200 performs a signal pattern analysis step S20. In the signal pattern analysis step S20, the signal processing unit 23 of the touch control module 200 analyzes and confirms a sensing signal detected in the detection step S10 and determines whether or not there is a manipulator's contact and touch operation.

The signal pattern analysis step S20 includes a human body touch confirmation step (S20a, S21, and S211), a touch manipulation confirmation step (S23, S231, S233, S235, S237, and S239), and an idle state control confirmation step (S25 and S251).

At the human body touch confirmation step (S20a, S21, and S211), the signal processing unit 23 of the touch control module 200 determines and confirms whether or not the manipulator's body is touched with the touch sensing unit 200. More specifically, the touch control module 200 further includes a storage unit 30 configured to store preset data including an initial value. The human body touch confirmation step (S20a, S21, and S211) comprises a delta capacitance confirmation step S20a, a human body touch determination step S21, and a human body touch on-setting step S211.

In the delta capacitance confirmation step S20a, the signal processing unit 23 of the touch control module 200 confirms whether or not the touch sensing unit 100 is in an idle state (IDLE=ON), and the sensing electrode of the touch sensing unit 100 confirms a delta capacitance value as a difference between an actual capacitance value and a reference value from the sensing signal. An initial value is used if there is no value in a previous step. The reference value can be formed so as to follow an actual current capacitance value in a preset manner, for example, in such a manner as to average a capacitance value in the previous step and a current capacitance value or form a proportional arithmetic expression. This is merely one example, and the arithmetic expression or structure of the reference value can be formed in various manners within a range of taking a method of reflecting and following the actual current capacitance value.

Figure 7:
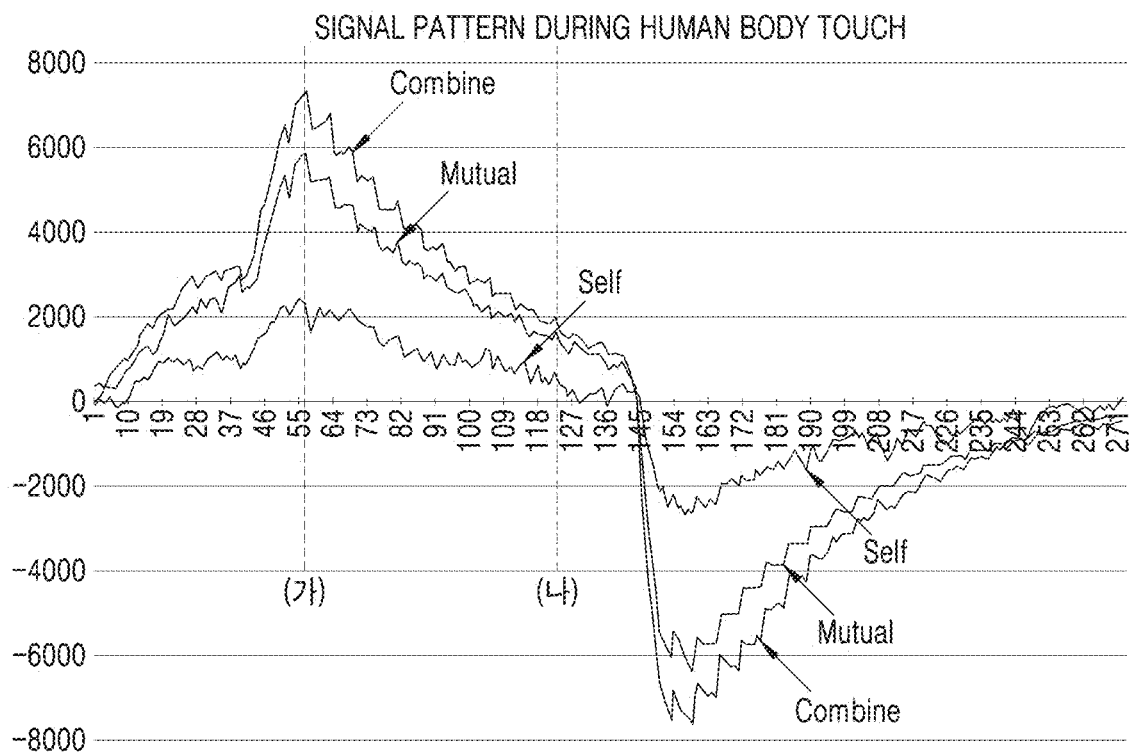
FIG. 7 is a diagrammatic view showing a delta capacitance value as a difference between a signal obtained at a sensor in self-capacitance, mutual-capacitance, and combined-capacitance measurement modes of a capacitive switch device and a reference value reflecting the obtained signal according to an embodiment of the present invention.
Figure 8:
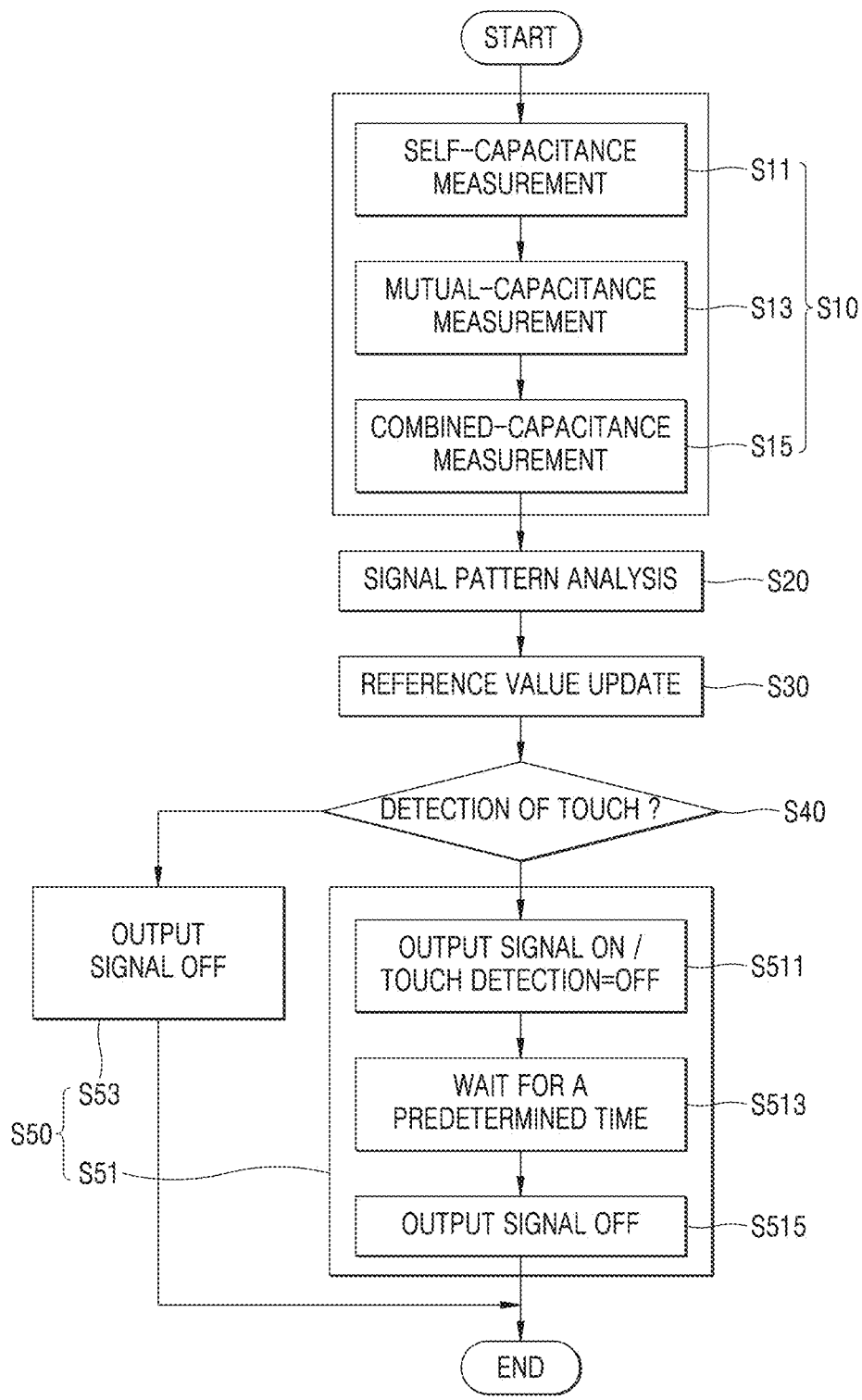
FIGS. 8 and 9 are flow charts showing a capacitive switch device control method according to an embodiment of the present invention.
Figure 9:
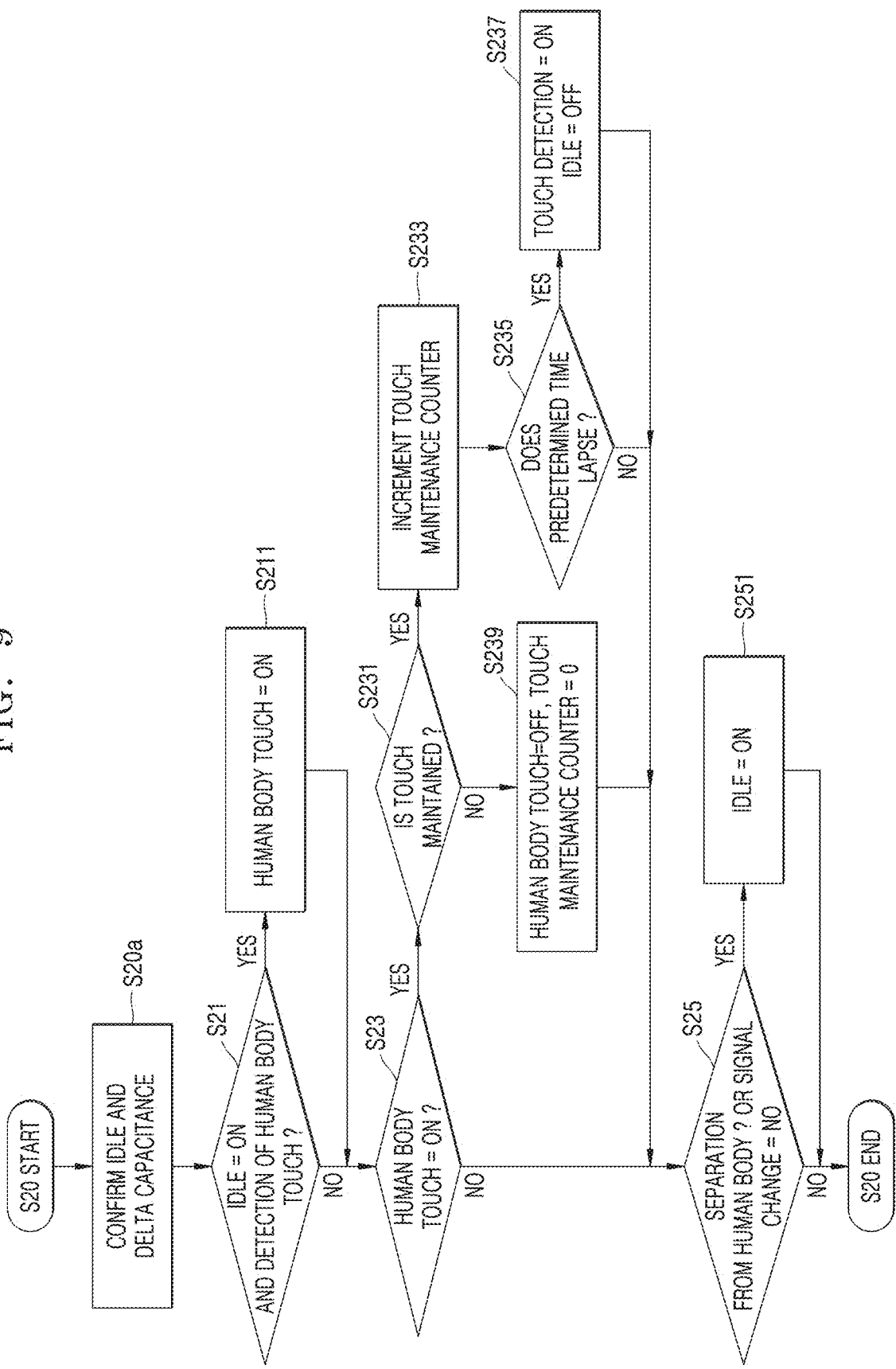

In the human body touch determination step S21, the signal processing unit 23 of the touch control module 200 compares the delta capacitance value with a preset attenuation amount included in the preset data stored in the storage unit 30 to determine whether or not there is a human body touch in the idle state of the touch sensing unit 100. In other words, as shown in FIG. 7, in the event of a human body touch state, when a difference between an actually detected current capacitance value and a reference value, i.e., the delta capacitance value is calculated, a configuration (a range between (A) and (B) of FIG. 7) is taken in which a capacitance value of a signal is constantly attenuated even in any one of the self-capacitance measurement mode, the mutual-capacitance measurement mode, and the combined-capacitance measurement mode. Through the use of this configuration, the preset attenuation amount included in the preset data stored in the storage unit 30 and the delta capacitance value are compared with each other to determine whether or not there is a human body touch.

By virtue of this process, if the signal processing unit 23 of the touch control module 200 determines that the delta capacitance value is a negative number that is smaller than the preset attenuation amount in the human body touch determination step S21, the program proceeds to the human body touch on-setting step S211 where the signal processing unit 23 determines a human body touch (HT) state in which the manipulator's body is touched with the touch sensing unit 100 to be ON.

Thereafter, the control flow proceeds to the touch manipulation confirmation step. In the touch manipulation confirmation step (S23, S231, S233, S235, S237, and S239), the signal processing unit 23 of the touch control module 200 determines whether or not the human body touch state is sustained based on a result of the determination of whether there is a human body touch in the human body touch confirmation step (S21 and S211) to confirm the manipulator's touch manipulation intention.

More specifically, the touch manipulation confirmation step (S23, S231, S233, S235, S237, and S239) includes a human body touch (HT) state determination step S23, a human body touch maintenance determination step S231, a touch maintenance counter incrementation step S233, a maintenance reference time lapse determination step S235, and a touch state confirmation step S237.

In the human body touch (HT) state determination step S23, the signal processing unit 23 of the touch control module 200 determines whether or not the human body touch state confirmed in the human body touch confirmation step (S20a, S21, and S211) is an ON state.

It the signal processing unit 23 of the touch control module 200 determines that the human body touch state confirmed in the human body touch confirmation step (S20a, S21, and S211) is not the ON state, the control flow proceeds to step S25.

On the contrary, if the signal processing unit 23 of the touch control module 200 determines that the human body touch state confirmed in the human body touch confirmation step (S20a, S21, and S211) is the ON state, the control flow proceeds to step S231.

The signal processing unit 23 of the touch control module 200 performs the human body touch maintenance determination step S231 where it determines whether or not a sensing signal indicating a touch state of the touch sensing unit 100 is sustained. In other words, although the touch state of the human body touch state with the touch sensing unit 100 has been confirmed, whether a user touches the touch sensing unit 100 with a direct intention to operate the switch device or barely touches the touch sensing unit 100 unintentionally can be confirmed through a touch time.

To this end, the touch maintenance counter incrementation step S233 is performed. If it is determined in the human body touch maintenance determination step S231 that the touch state is maintained, the control flow proceeds to the touch maintenance counter incrementation step S233 where the signal processing unit 23 of the touch control module 200 increments a touch maintenance counter using a counter 27 of the touch control module 200.

On the contrary, if it is determined in the human body touch maintenance determination step S231 that the touch state is not maintained, the signal processing unit 23 of the touch control module 200 determines that the user's touch state is released, switches the human body touch state to OFF, and resets the touch maintenance counter to zero (0) to cause a new idle operation to be performed (S239). At this point, the control flow proceeds to step S25.

After the touch maintenance counter has been incremented using the counter 27, the control flow proceeds to the maintenance reference time lapse determination step S235 where the signal processing unit 23 of the touch control module 200 compares a touch maintenance time with a maintenance reference time (ts) included in the preset data after the touch maintenance counter incrementation step S233 and determines whether or not a touch maintenance state is maintained for a predetermined time period. In other words, if the touch maintenance state is maintained for more than the preset maintenance reference time (ts), the signal processing unit 23 of the touch control module 200 determines such a touch to be a touch operation to which the manipulator's intention is reflected, but not a simple unintentional touch operation.

After the completion of the maintenance reference time lapse determination step S235, the control flow proceeds to the touch state confirmation step S237 or the step S25. If it is determined in the maintenance reference time lapse determination step S235 that the touch maintenance time exceeds the maintenance reference time (ts), the control flow proceeds to the touch state confirmation step S237 where the signal processing unit 23 of the touch control module 200 switches the touch detection state of the touch sensing unit 100 to ON, and sets the idle state of the touch sensing unit 100 to ON.

In other words, the signal processing unit 23 of the touch control module 200 determines that there is a user's intentional touch operation and switches the touch detection state of the touch sensing unit 100 to ON in such a manner as to set the operation state of the touch sensing unit 100 to an idle state "ON" to form an idle state for sensing other touch operation so as to enable the implementation of a subsequent operation so that the touch maintenance state can be maintained for more than the predetermined time period to form a signal output for a given touch operation.

On the other hand, if it is determined in the maintenance reference time lapse determination step S235 that the touch maintenance time does not exceed the maintenance reference time (ts), the control flow proceeds to step S25 where the signal processing unit 23 of the touch control module 200 determines whether or not an incremented state of the touch is repeated.

Thereafter, the idle state control confirmation step (S25 and S251) is performed. In the idle state control confirmation step (S25 and S251), the signal processing unit 23 of the touch control module 200 controls an idle state of the touch sensing unit 100 based on a result of the confirmation of the manipulator's touch manipulation intention in the touch manipulation confirmation step. In other words, if the human body touch state is terminated, i.e., a capacitance value is inputted no longer or there is no signal change, the signal processing unit 23 of the touch control module 200 determines that there exists no input signal and performs an idle state formation step S251 of re-forming an idle state.

After such a signal pattern analysis process has been performed, the signal processing unit 23 updates the reference value calculated in the previous step to calculate a new reference value (S30). That is, in the reference value update step S30, the signal processing unit 23 updates a reference value of the touch sensing unit 100 using a sensing signal calculated in the signal pattern analysis step S20. More specifically, the reference value update step S30 includes calculating and updating the reference value using a previous delta capacitance calculated from an initial set value included in the preset data stored in the storage unit 30 or a previous sensing signal, and a current delta capacitance calculated from a current sensing signal in the signal pattern analysis step.

A reference value following a capacitance value obtained in the current touch operation can be calculated through an arithmetic process using a previous delta capacitance obtained in a previous touch operation and a current delta capacitance obtained in a current touch operation, and a capacitance value obtained in the previous touch operation and the capacitance value obtained in the current touch operation.

As described above, various modifications can be made to this embodiment depending on design specifications within a range of implementing a calculation structure in which a capacitance value based on a currently sensed signal of the reference value is reflected to calculate the delta capacitance.

The output mode execution step (S40 and S50) comprises executing an output mode of determining whether or not to output an output signal based on a result of the determination performed in the signal pattern analysis step S20. The output mode execution step (S40 and S50) includes a touch detection state determination step S40 and an output control step S50.

In the touch detection state determination step S40, the signal processing unit 23 determines whether or not the touch detection state is an ON state. In output control step S5, if it is determined in the touch detection state determination step S40 that the touch detection state is the ON state, the signal processing unit 23 switches the touch detection state to an OFF state and controls an output control signal to be outputted to the outside through the signal output unit.

In addition, more specifically, the output control step S50 includes a signal output step S511, an output switching standby step S513, and an output signal off-setting step S515.

If it is determined in the touch detection state determination step S40 that the touch detection state is the ON state, the control flow proceeds to the signal output step S511 where the signal processing unit 23 of the touch control module 200 switches the touch detection state to the OFF state and controls the output control signal for application to the signal output unit 25 to switch an output signal to the ON state to be outputted to the outside.

Thereafter, the output switching standby step S513 permits a wait for a preset time included in the preset data. Then, if there is a wait for more than the preset time in the output switching standby step S513, the state of the output signal is switched to OFF to interrupt the output of the signal to the outside from the signal output unit.

Figure 10:
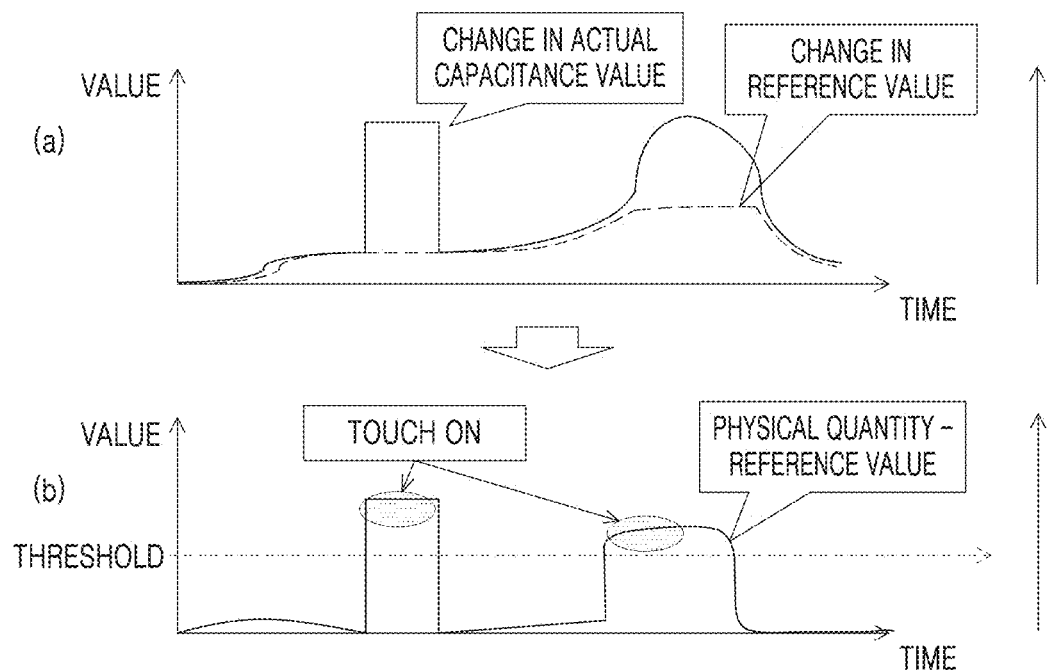
FIGS. 10 and 11 are diagrammatic views showing a sensing signal, a reference value, and a delta capacitance value in a touch implementation example of a conventional touch sensor and a capacitive switch device according to an embodiment of the present invention.
Figure 11:
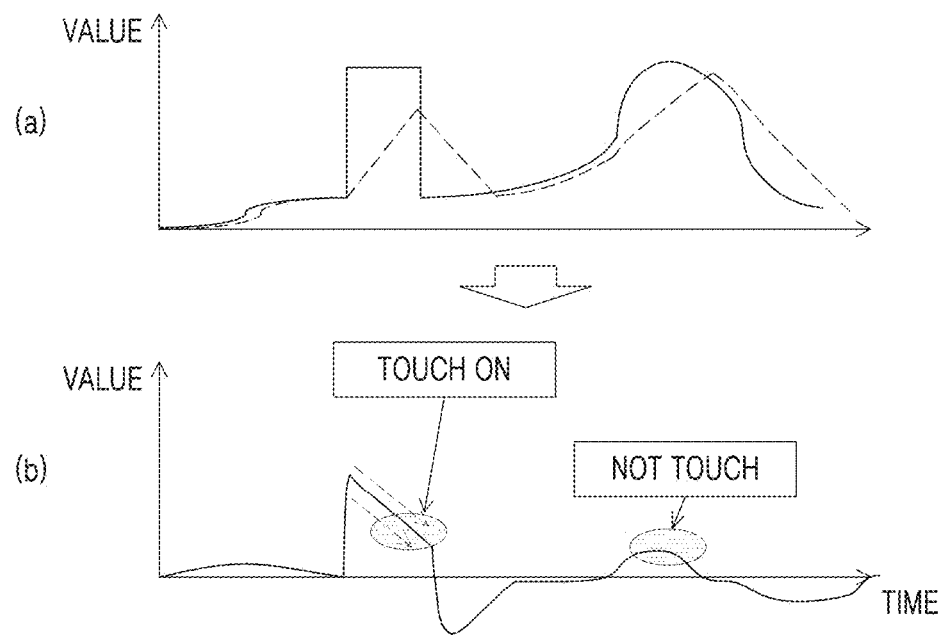

A trend of the delta capacitance value calculated based on a difference between an actual capacitance value obtained in a current touch operation and a reference value will be described with reference to the drawings. In other words, FIG. 10 shows a diagrammatic view showing sensing characteristics of a sensed capacitance value/a reference value and a delta capacitance value of a conventional touch sensor, and FIG. 11 shows a diagrammatic view showing sensing characteristics of a sensed capacitance value/a reference value and a delta capacitance value of the capacitive switch device according to an embodiment of the present invention. In the case of the conventional touch sensor of FIG. 10, there are shown a change in the actual capacitance value and a change in the reference value according to a conventional method (see FIG. 10(a)), and a delta capacitance value calculated based on a difference between the changes (see FIG. 10(b)). In the case of the conventional method, if the delta capacitance value is more than a predetermined threshold value, this is determined to be a touch state so that the touch sensor determines that a twice touch operation is performed with respect to a one-time actual touch operation and a one-time change in moisture content on the drawing.

On the other hand, in the case of using a reference value following an actual capacitance value according to an embodiment of the present invention, the inventive capacitive switch device determines that a one-time actual touch operation is performed based on an attenuation state of the delta capacitance value in the case of the one-time actual touch operation and determines that a user does not touch the touch sensing unit because an attenuation state is not formed in which the delta capacitance value is more than a predetermined value
in the case of the one-time change in moisture content using the fact that the attenuation state (see FIG. 7) of a capacitance value is formed if there is a user's direct touch. Resultantly, the inventive capacitive switch device determines that the touch operation is performed a total of one time.

The above-mentioned embodiments are merely examples for explaining the present invention, and the present invention is not limited thereto. A capacitance value formed based on a sensing signal is actually reflected to the formation of a reference value, the present invention can also be applied to a field to which various capacitive switches applied in addition to vehicles, and the inventive capacitive switch device can be modified in various manners within a range of taking a structure of determining whether or not there is a human body touch based on the reference value reflecting or following an actual capacitance value.

While the present invention has been described in connection with the exemplary embodiments illustrated in the drawings, they are merely illustrative and the invention is not limited to these embodiments. It will be appreciated by a person having an ordinary skill in the art that various equivalent modifications and variations of the embodiments can be made without departing from the spirit and scope of the present invention. Therefore, the true technical scope of the present invention should be defined by the technical sprit of the appended claims.

What is claimed is:

1. A capacitive switch device comprising:
   a substrate;
   a touch sensing unit including a sensing electrode and a transmission electrode, which are disposed on the substrate; and
   a touch control module having circuits disposed on the substrate, and configured to confirm that the touch sensing unit is in a state of being touched by a human body based on a sensing signal from the touch sensing unit and output a touch output signal,
   wherein the transmission electrode outputs a transmission signal in response to a transmission control signal from the touch control module, and the sensing electrode is activated in response to a sensing control signal from the touch control module, and
   wherein the touch control module is configured to selectably activate, in response to the touch output signal, the sensing electrode and the transmission electrode according to any of a plurality of measurement modes including:
      a self-capacitance measurement mode in which the sensing electrode is activated, the transmission electrode is deactivated, and the touch sensing unit measures a self-capacitance value;
      a mutual-capacitance measurement mode in which the sensing electrode is deactivated, the transmission electrode is activated, and the touch sensing unit measures a mutual-capacitance value; and
      a combined-capacitance measurement mode in which the sensing electrode and the transmission electrode are activated, and the touch sensing unit measures a combined-capacitance value.

2. The capacitive switch device according to claim 1, wherein the sensing electrode and the transmission electrode are respectively disposed on both surfaces of the substrate.

3. The capacitive switch device according to claim 1, wherein the sensing electrode and the transmission electrode are disposed on a same surface of the substrate.

4. The capacitive switch device according to claim 3, wherein the transmission electrode is disposed at an outer periphery of the sensing electrode.

5. The capacitive switch device according to claim 1, wherein the touch control module comprises:
   a touch sensor control unit configured to apply the transmission control signal to the transmission electrode to activate the transmission electrode and the sensing control signal to the sensing electrode to activate the sensing electrode;
   a signal processing unit configured to process a detection signal detected by the sensing electrode; and
   a signal output unit configured to output the detection signal processed by the signal processing unit to an outside.

6. The capacitive switch device according to claim 5, wherein the touch sensor control unit executes the self-capacitance measurement mode of activating the sensing electrode and deactivating the transmission electrode.

7. The capacitive switch device according to claim 5, wherein the touch sensor control unit executes the mutual-capacitance measurement mode of deactivating the sensing electrode and activating the transmission electrode.

8. The capacitive switch device according to claim 5, wherein the touch sensor control unit executes the combined-capacitance measurement mode of activating the sensing electrode and the transmission electrode.

9. The capacitive switch device of claim 5, wherein the touch sensor control unit is further configured to establish sole activation of the sensing electrode, sole activation of the transmission electrode, and activation of both the sensing electrode and the transmission electrode.

10. The capacitive switch device of claim 5, wherein the signal processing unit is configured to analyze a signal pattern using data calculated from the detection signal and perform an operation of determining a user's direct contact or operation intention.

* * * * *